(12) United States Patent
Ginn et al.

(10) Patent No.: US 7,544,532 B2
(45) Date of Patent: Jun. 9, 2009

(54) INFRARED PHOTODIODES AND SENSOR ARRAYS WITH IMPROVED PASSIVATION LAYERS AND METHODS OF MANUFACTURE

(75) Inventors: Robert P. Ginn, Ventura, CA (US); Kenneth A. Gerber, Santa Maria, CA (US); Andreas Hampp, Santa Barbara, CA (US); Alexander C. Childs, Goleta, CA (US)

(73) Assignee: Raytheon Company, Waltham, MA (US)

( * ) Notice: Subject to any disclaimer, the term of this patent is extended or adjusted under 35 U.S.C. 154(b) by 463 days.

(21) Appl. No.: 11/582,937

(22) Filed: Oct. 17, 2006

(65) Prior Publication Data

US 2008/0090319 A1 Apr. 17, 2008

(51) Int. Cl.
*H01L 21/00* (2006.01)
*H01L 31/00* (2006.01)

(52) U.S. Cl. .............................. 438/63; 438/77; 438/93; 257/428; 257/431

(58) Field of Classification Search .................. 438/59, 438/63, 69, 73, 77, 93, 94, 98; 257/428, 257/431, 437, 443
See application file for complete search history.

(56) References Cited

U.S. PATENT DOCUMENTS

| | | | |
|---|---|---|---|
| 4,696,094 A | 9/1987 | Yves et al. | |
| 4,935,384 A | 6/1990 | Wanlas | |
| 5,296,384 A | 3/1994 | Cockrum et al. | 437/5 |
| 5,401,986 A | 3/1995 | Cockrum et al. | 257/188 |
| 5,646,437 A * | 7/1997 | Kasai et al. | 257/437 |

(Continued)

FOREIGN PATENT DOCUMENTS

DE 198 38 430 A1 3/2000

(Continued)

OTHER PUBLICATIONS

Rehm, R. et al, Passivation of InAs/(GaIn)Sb short-period super lattice photodiodes . . . , App Phys Ltrs, AIP, Amer Inst Phys, Apr. 18, 2005, vol. 86, No. 17, p. 173501.

(Continued)

*Primary Examiner*—Kevin M Picardat
(74) *Attorney, Agent, or Firm*—Leonard A. Alkov (57) ABSTRACT

InSb infrared photodiodes and sensor arrays with improved passivation layers and methods for making same are disclosed. In the method, a passivation layer of AlInSb is deposited on an n-type InSb substrate using molecular beam epitaxy before photodiode detector regions are formed in the n-type substrate. Then, a suitable P+ dopant is implanted directly through the AlInSb passivation layer to form photodiode detector regions. Next, the AlInSb passivation layer is selectively removed, exposing first regions of the InSb substrate, and gate contacts are formed in the first regions of the InSb substrate. Then, additional portions of the AlInSb passivation layer are selectively removed above the photodiode detectors exposing second regions. Next, metal contacts are formed in the second regions, and bump contacts are formed atop the metal contacts. Then, an antireflection coating is applied to a side of the substrate opposite from the side having the metal and bump contacts. Forming the AlInSb passivation layer before the photodiode detector regions reduces the number of defects created in the n-type InSb substrate during fabrication in comparison to conventional methods and improves the noise performance of InSb photodiodes and sensor arrays incorporating the improved passivation layer.

19 Claims, 11 Drawing Sheets

U.S. PATENT DOCUMENTS 6,274,882 B1 * 8/2001 Verie et al. .................... 257/22
6,548,878 B1 * 4/2003 Nauleau et al. ............. 257/431
2003/0070707 A1 4/2003 King

FOREIGN PATENT DOCUMENTS

FR    2 647 595 A    11/1990

OTHER PUBLICATIONS

Su, Y.K. et al, Origins of 1/f noic4e in indium antimonide photodiodes . . . , Journal of Appl Phys, Amer Inst of Phys, Jan. 15, 1997, vol. 81, No. 2, p. 739.

Desalvo, G. et al, A New Technique for Testing Surface Passivation Techniques . . . , Proceed of SPIE, WA, Sep. 6, 1988, vol. 992, pp. 336-343.

Mauk, M.G. et al, Study of Novel Chemicalo Surface Passivation Techniques . . . , Appl Phys Letters, AIP, Amer Inst of Phys, Jan. 16, 1989, vol. 54, No. 3, pp. 213-215.

Khaleque, F., Metal-insulator-semiconductor structures of InSb . . . , Letters, IEE Stevenage, GB, vol. 31, No. 6, pp. 500-502, Mar. 16, 1995.

* cited by examiner

FIG. 1

PRIOR ART

FIG. 3

PRIOR ART

INFRARED PHOTODIODES AND SENSOR ARRAYS WITH IMPROVED PASSIVATION LAYERS AND METHODS OF MANUFACTURE

TECHNICAL FIELD

The present invention generally concerns infrared photodiodes and sensor arrays and methods of manufacture of infrared photodiodes and sensor arrays, and more specifically concerns InSb infrared photodiodes and sensor arrays with improved passivation layers, and methods for manufacturing InSb infrared photodiodes and sensor arrays with improved passivation layers.

BACKGROUND

InSb-based photodiode detectors are used in many infrared sensor applications. InSb-based detectors have found particular use in infrared detection and imaging applications in the 3-5 micron IR wavelength band. Infrared detectors and imaging devices such as FLIRs (Forward-Looking Infrared) are particularly useful due to their ability to operate in conditions where imaging operations in the visible spectrum are being negatively impacted by reduced visibility. For example, infrared imaging devices can provide useful real-time images at night. Infrared imaging devices also can provide useful real-time images during daytime when imaging operations in the visible spectrum have been degraded due to smoke or sand.

Those designing InSb-based photodiodes and sensor arrays are always seeking ways to improve the sensitivity of such devices. Increased sensitivity generally makes detectors and imaging devices more useful because the noise-equivalent power is reduced, meaning that less thermal contrast between targets and background is required in order to distinguish the targets from the background.

Limitations in sensor performance often are the by-product of manufacturing processes. In particular, manufacturing processes create minute imperfections in detector surfaces. These imperfections reduce the noise performance of sensors from ideal. Accordingly, those skilled in the art are always seeking manufacturing processes that result in relatively fewer imperfections and thus increase the noise performance of such sensors.

SUMMARY OF THE PREFERRED EMBODIMENTS

A first embodiment of the invention is a method comprising: forming a passivation layer on a first surface of a Group III-V substrate using a wide bandgap material; and selectively implanting P+ species through the passivation layer to form P+ regions below the first surface of the Group III-V substrate, the P+ regions in combination with adjacent portions of the Group III-V substrate forming photodiode detectors.

A second embodiment of the invention is a photodiode comprising: an n-type InSb substrate, the n-type InSb substrate having first and second surfaces; a P+ region formed in a region of the n-type InSb substrate below the first surface of the n-type InSb substrate; an AlInSb passivation layer positioned atop the first surface of the n-type InSb substrate, the AlInSb passivation layer having an opening above the P+ region; a metal contact positioned in the opening above the P+ detector; and a bump contact positioned atop the metal contact.

A third embodiment of the invention is an infrared sensor array comprising: an n-type InSb substrate having first and second surfaces; a two-dimensional array of photodiode detectors comprising non-contiguous P+ regions positioned beneath the first surface of the n-type InSb substrate and portions of the n-type InSb susbtrate adjacent to the P+ regions; an AlInSb passivation layer positioned atop the first surface of the n-type InSb substrate; a plurality of first openings in the AlInSb passivation layer exposing the InSb substrate; a plurality of gate contacts, each of the plurality of gate contacts formed in one of the plurality of first openings; a plurality of second openings formed in the AlInSb passivation layer above each of the P+ regions; a plurality of metal contacts, each of the plurality of metal contacts formed in one of the plurality of second openings above each of the P+ regions; and a plurality of bump contacts, each of the plurality of bump contacts positioned above one of the plurality of metal contacts.

A fourth embodiment of the invention is a method for forming a sensor array comprising: forming an AlInSb passivation layer on a first surface an InSb substrate; forming a two-dimensional array of non-contiguous photodiode detectors by implanting P+ species through the AlInSb passivation layer; selectively removing first portions of the AlInSb passivation layer to expose first regions of the n-type InSb substrate; forming gate contacts in the first regions; selectively removing second portions of the AlInSb passivation layer above the photodiode detectors, exposing second regions of the InSb substrate; forming metal contacts in each of the second regions; and forming bump contacts on the metal contacts.

BRIEF DESCRIPTION OF THE DRAWINGS

The foregoing and other aspects of these teachings are made more evident in the following Detailed Description of the Preferred Embodiments, when read in conjunction with the attached Drawing Figures, wherein.

DETAILED DESCRIPTION OF THE PREFERRED EMBODIMENTS

Figure 1:
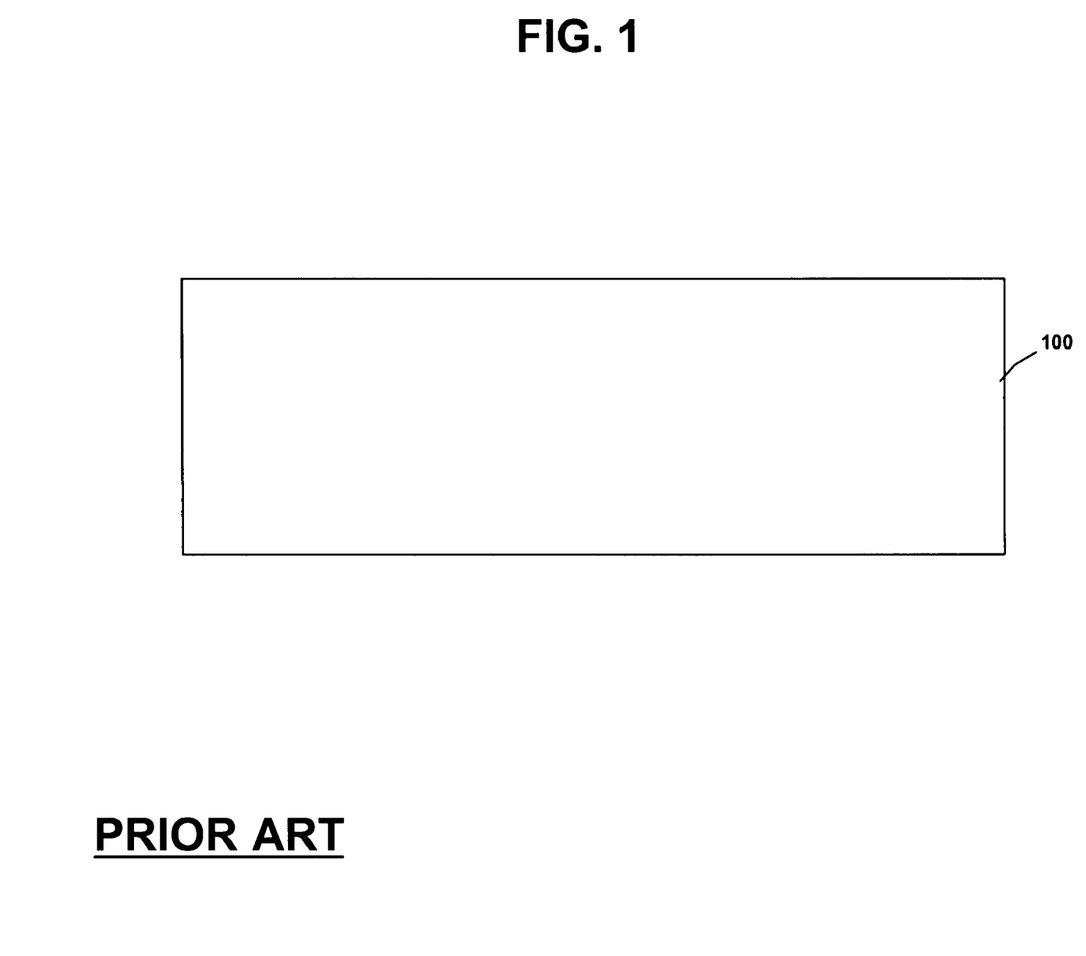
FIG. 1 depicts the result of steps of a processing method operating in accordance with the prior art.
Figure 2:
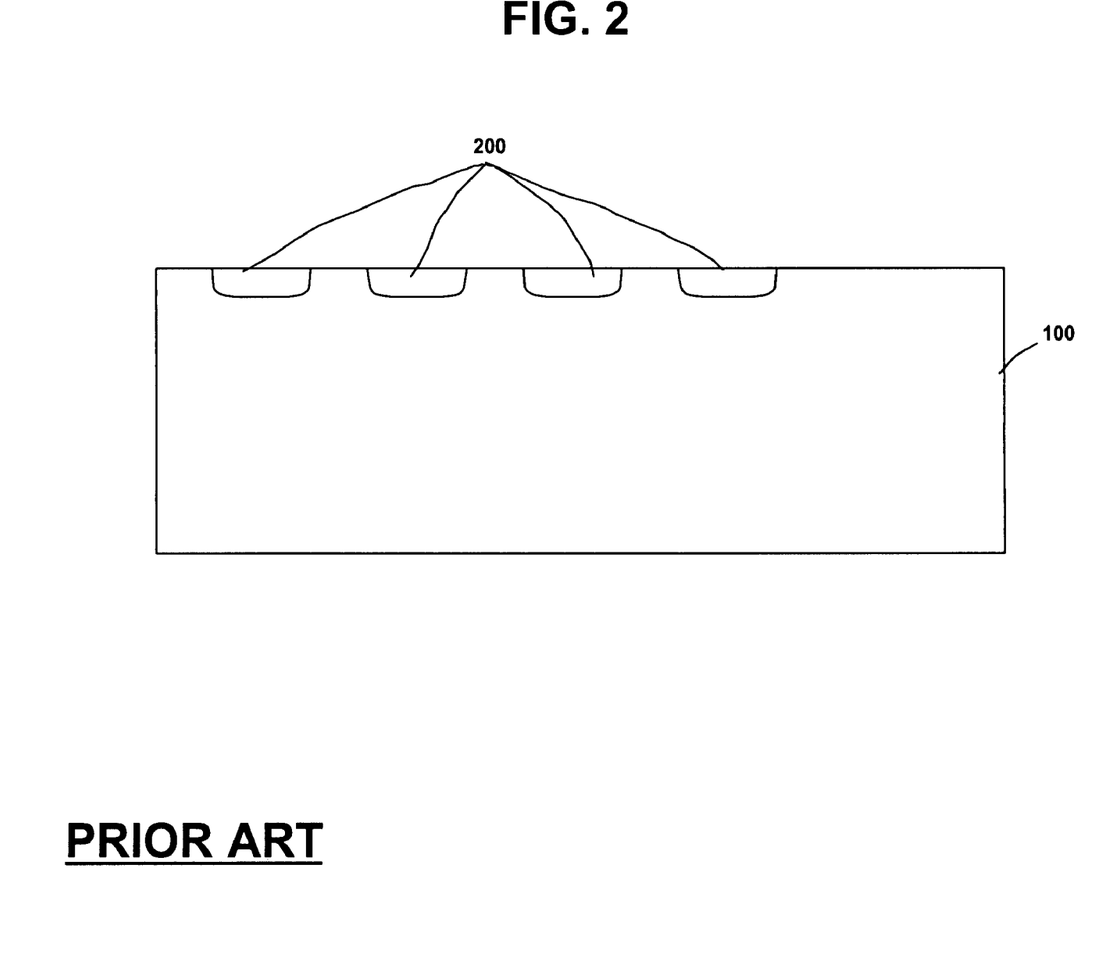
FIG. 2 depicts the result of steps of a processing method operating in accordance with the prior art.
Figure 3:
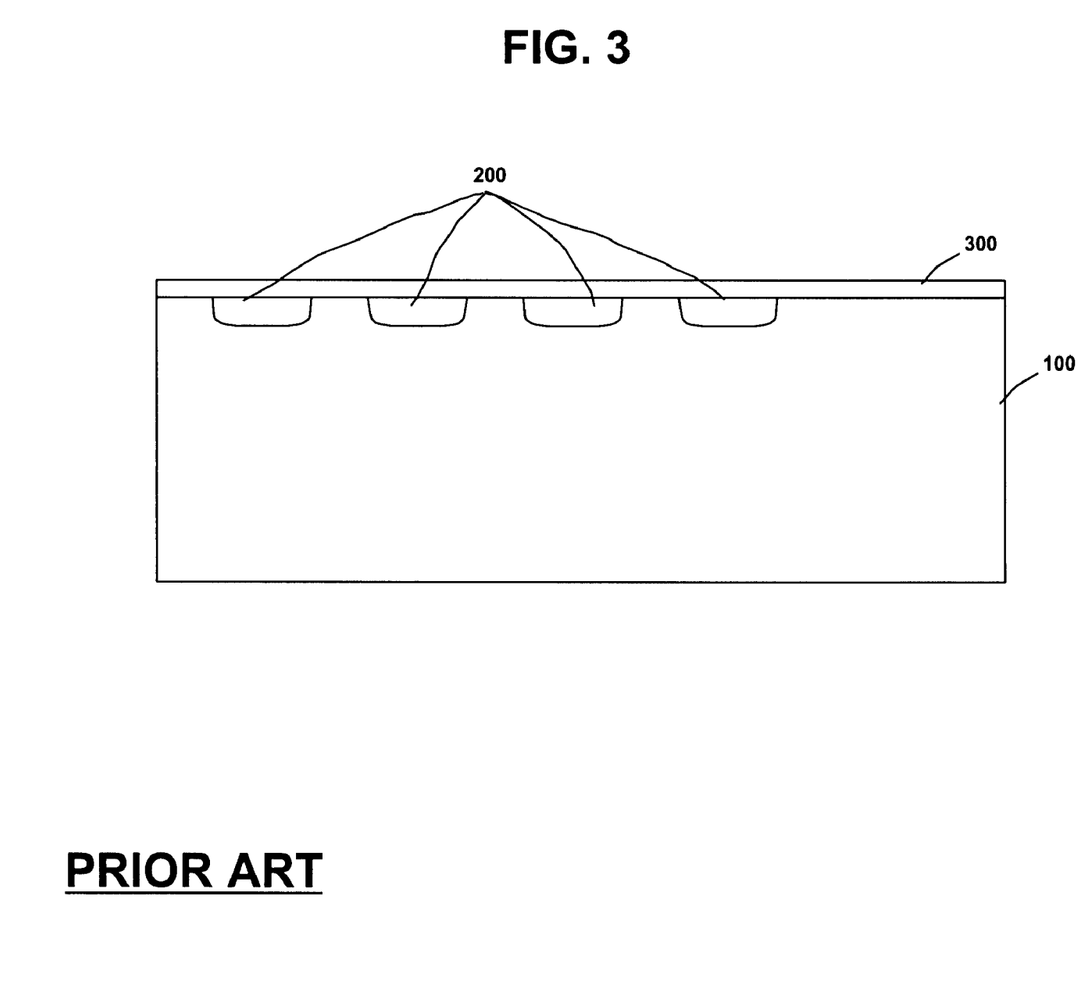
FIG. 3 depicts the result of steps of a processing method operating in accordance with the prior art.

FIGS. 1-3 depict the end result of processing steps performed in accordance with the prior art. In FIG. 1 an n-type InSb substrate is depicted. Then, processing steps are performed on the n-type InSb substrate 100 to form a plurality of p-n photodiode detector regions 200. These steps conventionally comprise forming an oxide layer; etching the oxide layer where the detector regions will be formed; and implanting suitable P+ species such as Be into the InSb substrate in the etched regions. The oxide layers associated with the formation of the detector regions are then removed. The end result of such steps is depicted in FIG. 2. Next, a passivation layer is formed on what will comprise the backside surface of the InSb substrate. The passivation layer 300 is positioned above the photodetectors 200. A conventional method of forming a passivation layer comprises applying a 1000 Å thick layer of $Si_3N_4$ to the n-type InSb substrate through an anodic process. The end result of formation of a passivation layer in accordance with the prior art is depicted in FIG. 3.

It has been found that the conventional processing steps associated with formation of detector regions 200 introduce surface defects in the n-type InSb substrate which result in a relatively high surface recombination velocity. The relatively high surface recombination velocity results in relatively high dark current and noise equivalent powers for sensor arrays made in accordance with the prior art. These drawbacks have been partially addressed in the past through cryogenic cooling of sensor arrays, but such cooling only serves to recover a portion of the sensitivity of the sensor lost through these processes. In addition, cryogenic cooling is expensive and requires significant maintenance. Accordingly, those skilled in the art seek fabrication and passivation methods that reduce defects formed in the InSb substrate as a result of production, and reduce or eliminate the need for cryogenic cooling.

Figure 4:
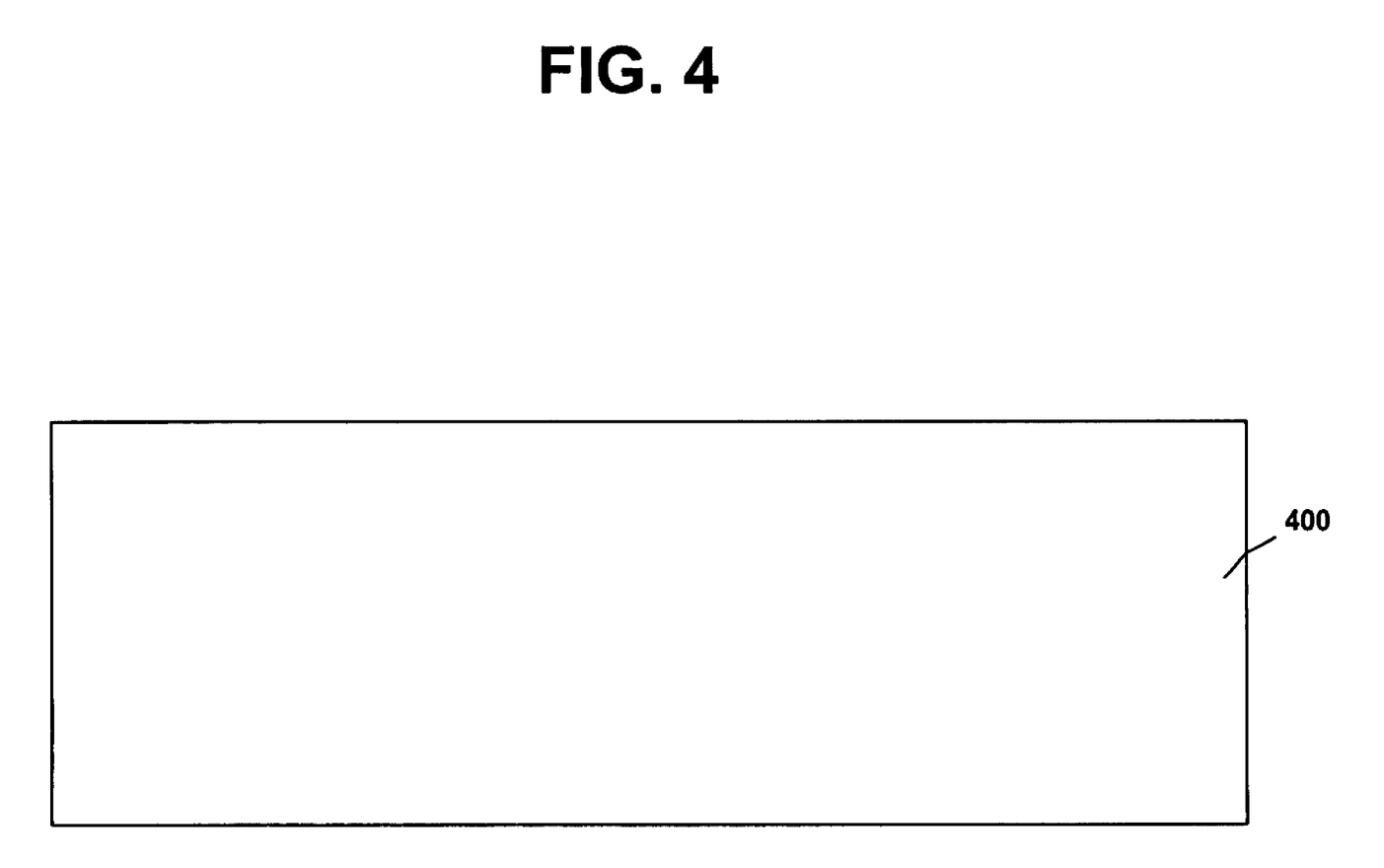
FIG. 4 depicts the result of steps of a processing method operating in accordance with the invention.
Figure 5:
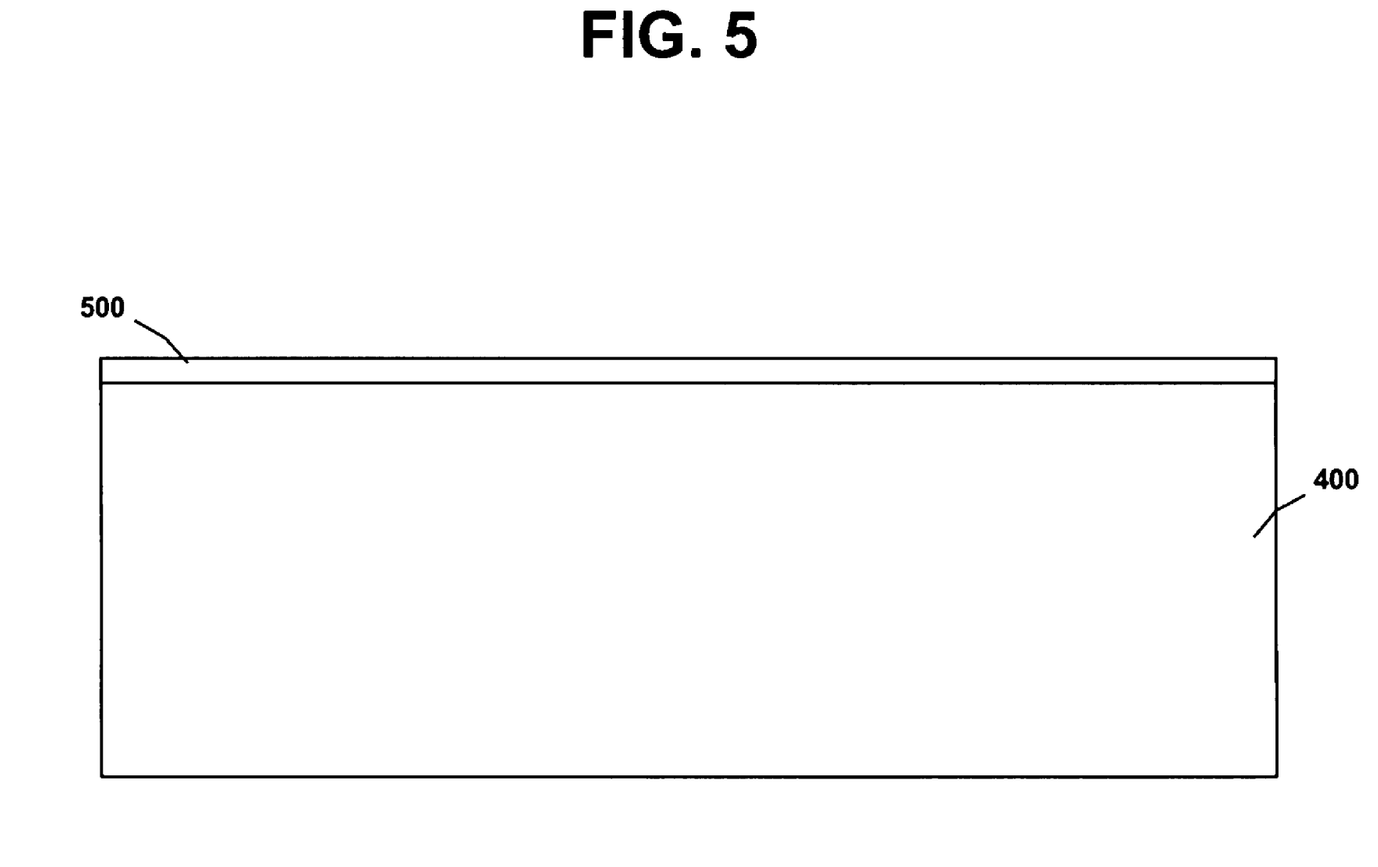
FIG. 5 depicts the result of steps of a processing method operating in accordance with the invention.
Figure 6:
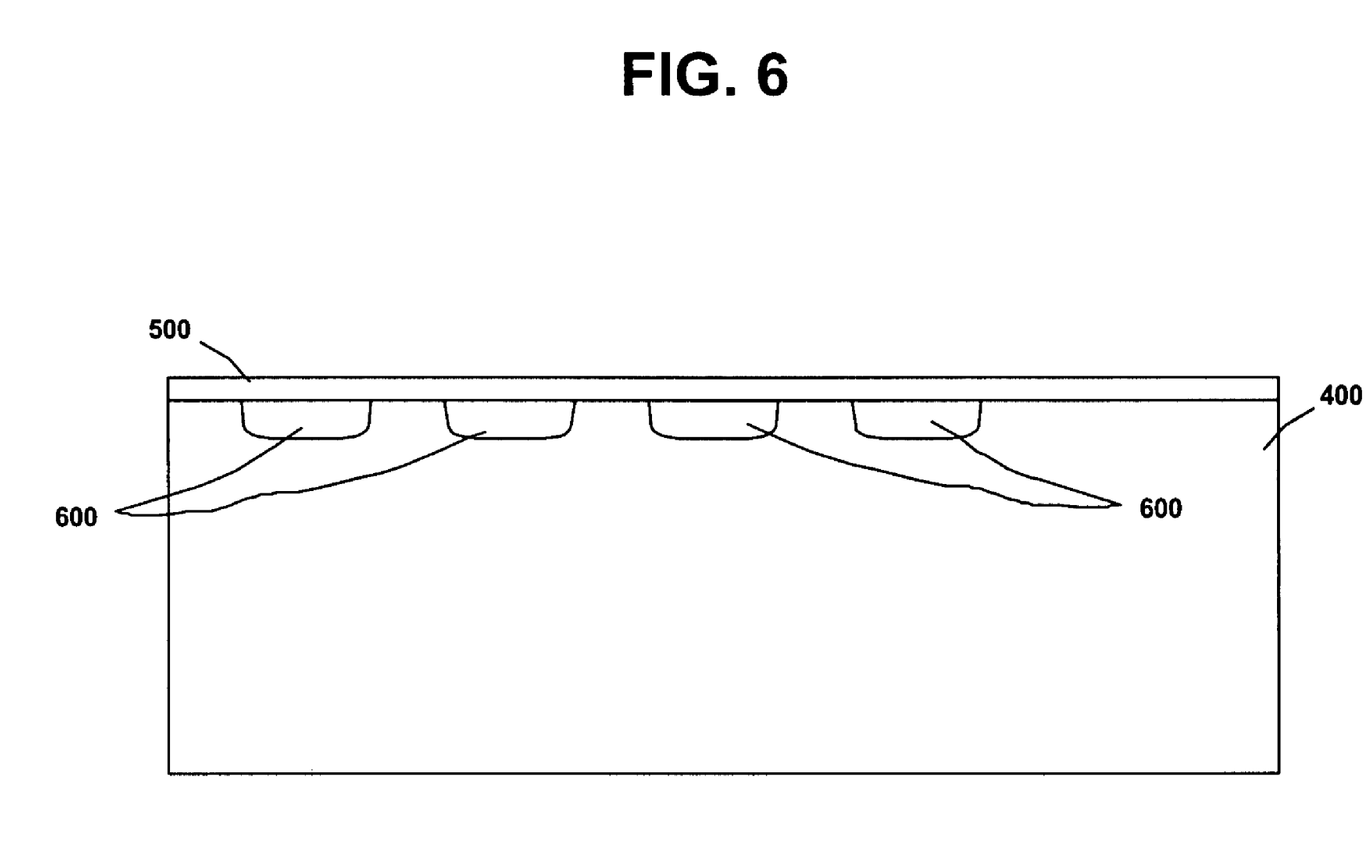
FIG. 6 depicts the result of steps of a processing method operating in accordance with the invention.

FIGS. 4-9 depict the result of several processing steps performed on an n-type InSb substrate 400 including those performed in accordance with the invention. The n-type InSb substrate can be grown by several conventional methods, such as by solidifying a melt from the liquid state, or epitaxially by liquid phase epitaxy, hot wall epitaxy, or molecular beam epitaxy. It can also be grown from organometallic compounds by MOVPE (metallic organic phase epitaxy). The end result of substrate formation steps is depicted in FIG. 4, showing an n-type InSb substrate 400 ready for additional processing steps. In contrast to conventional fabrication methods described above with reference to FIGS. 1-3 where detector regions are formed in the InSb substrate prior to passivation, in the method of the invention a passivation layer 500 is formed on a first surface of the InSb substrate 400 prior to the formation of the photodiode detector regions. In the method of the invention, the passivation layer is formed from material both having a relatively wider bandgap when compared to the n-type InSb substrate and a good lattice constant match with the n-type InSb substrate. In an exemplary step of the method, the passivation layer comprises AlInSb, and a 2000 Å thick AlInSb passivation layer 500 is deposited by molecular beam epitaxy on the first surface of the InSb substrate 400. The end result of such a step is depicted in FIG. 5. Next, the p-n photodiode detector regions are formed in the substrate 400. In this step, an oxide layer (not shown) is grown on the AlInSb passivation layer and suitably etched in regions where the p-n photodiode detectors will be formed. Once etched, p-type material such as Beryllium is implanted through the revealed AlInSb passivation layer 300 into the InSb substrate 400 with sufficient power to form the p+ regions 600 which comprise one-half of the photodiode detectors. The end result of the step is depicted in FIG. 6.

Figure 7:
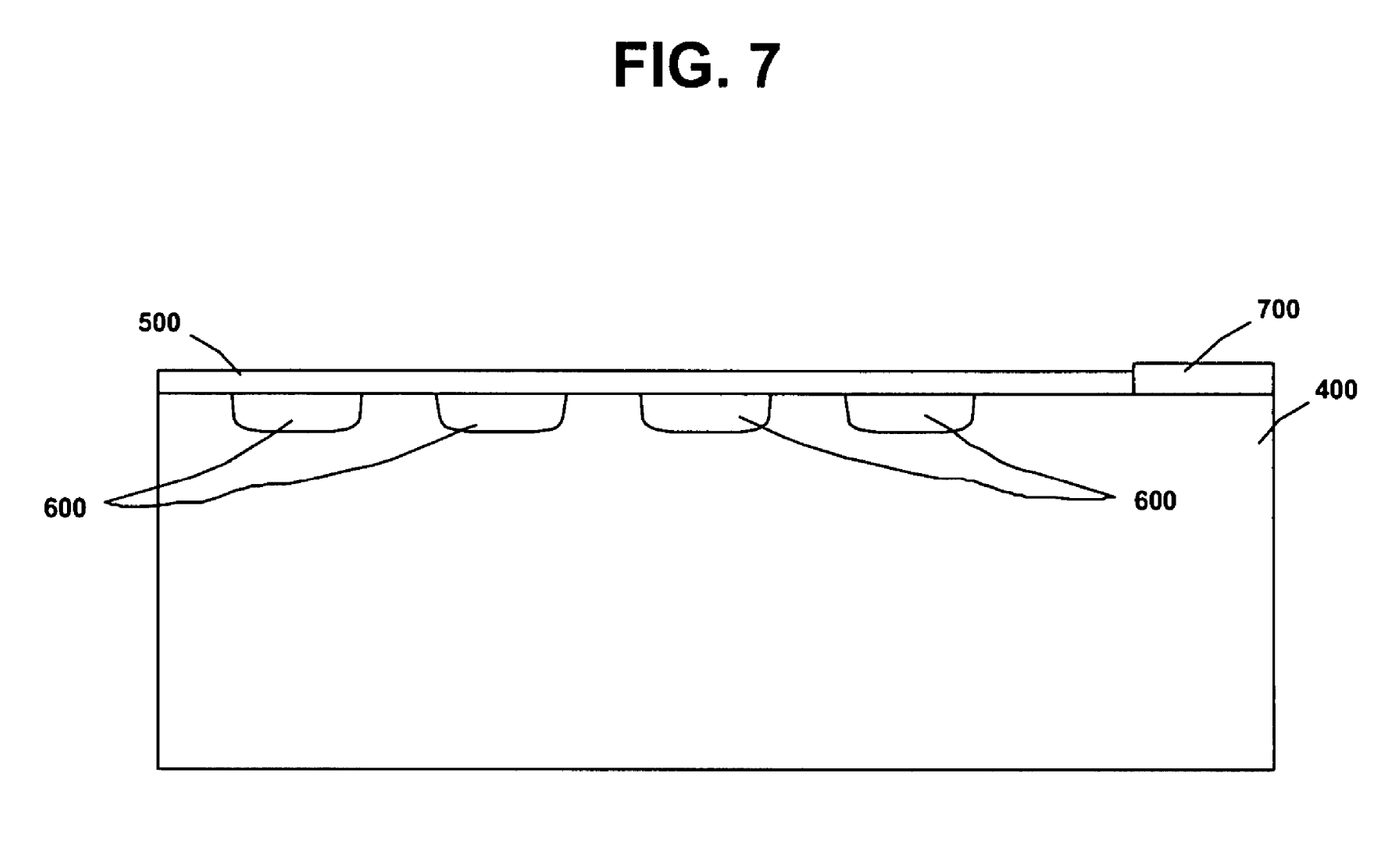
FIG. 7 depicts the result of steps of a processing method operating in accordance with the invention.

Next, gate regions are formed in the substrate. Again, an oxide layer (not shown) is grown on an exposed surface of the InSb subtrate 400 above the AlInSb 500 passivation layer, and then suitably etched to reveal the InSb substrate 400. Gate regions 700 are then formed in the etched regions by, for example, depositing a 900 Å thick layer of AlNi. The end result of this step is depicted in FIG. 7.

Figure 8:
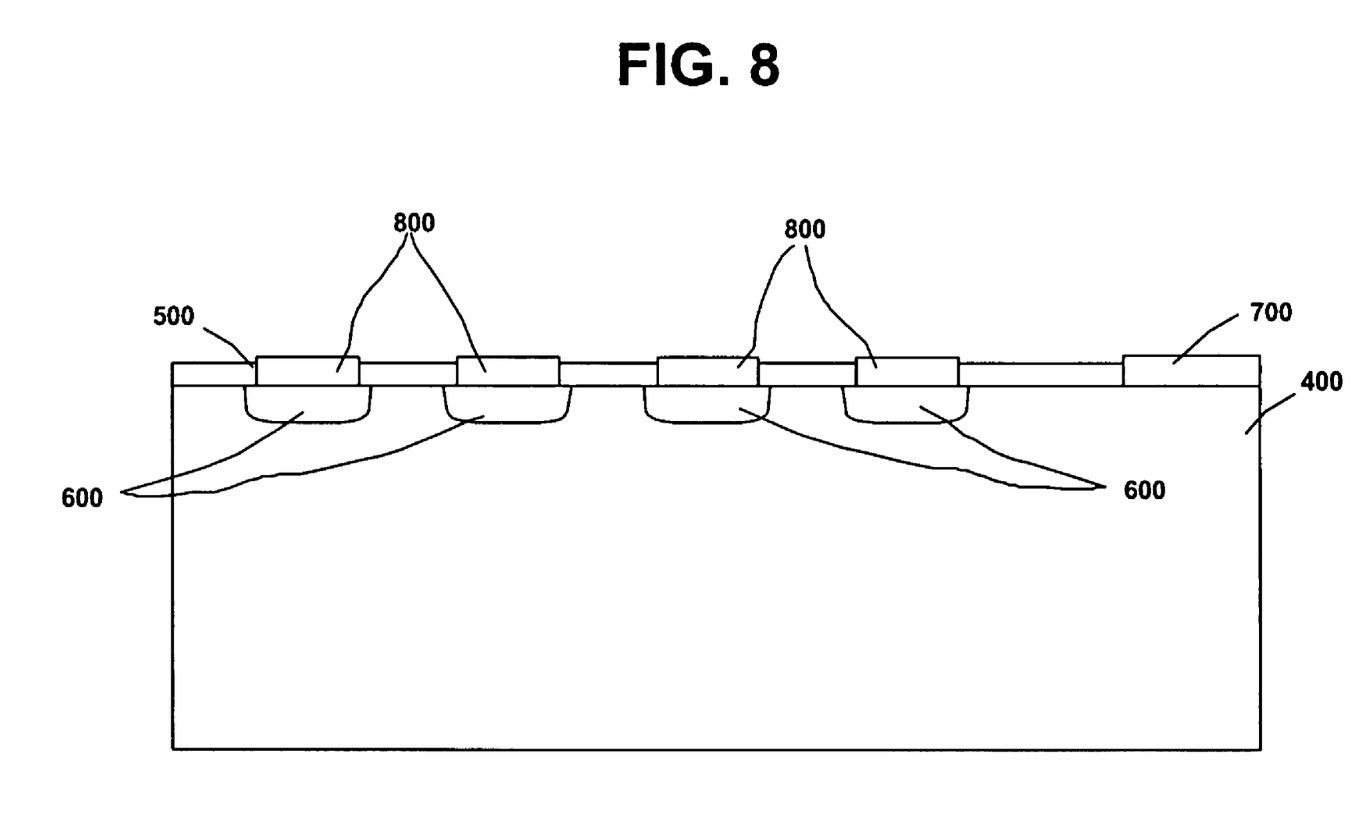
FIG. 8 depicts the result of steps of a processing method operating in accordance with the invention.
Figure 9:
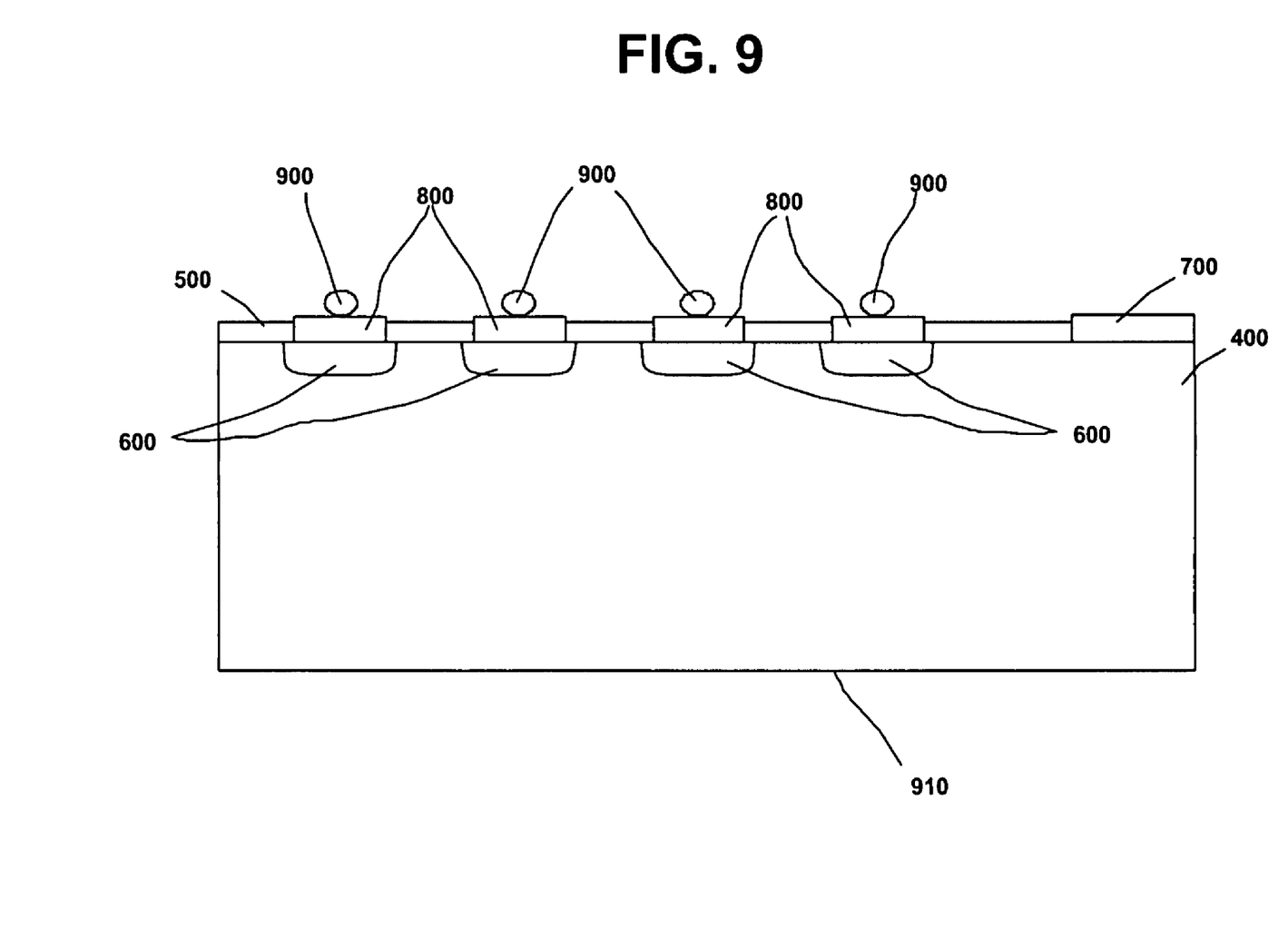
FIG. 9 depicts the result of steps of a processing method operating in accordance with the invention.

Then, metallic contacts are formed in regions above the p+ regions 600 of the p-n photodiode detector regions by suitable oxide growth, etching and deposition steps. The metallic contacts 800 formed as an end result of these processing steps are depicted by FIG. 8. Suitable contacts comprise 1500 Å or 1100 Å thick layers of MoNi. Next indium bump contacts 900 are formed by suitable processing steps as shown in FIG. 9. In an optional additional step, an antireflection coating may be applied to a second surface 910 of the n-type InSb substrate.

Figure 10:
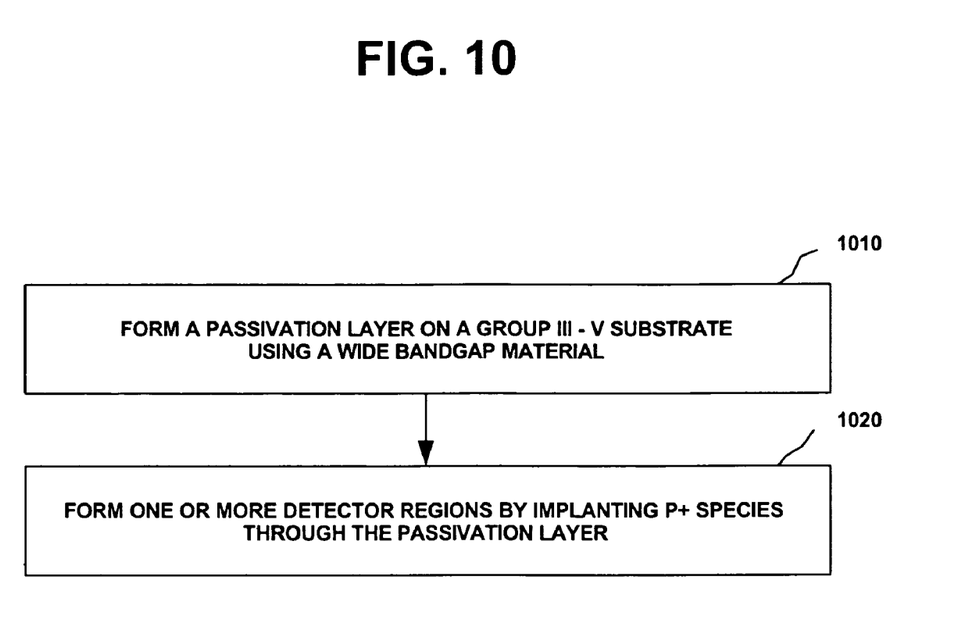
FIG. 10 is a flow chart depicting a method in accordance with the invention.

FIG. 10 is a flowchart depicting a method in accordance with the invention that may be practiced when fabricating infrared photodiodes and infrared sensor arrays in Group III-V substrates. In the method at step 1010, a passivation layer of wide bangap material (such as, for example, AlInSB) is formed on a Group III-V substrate (such as, for example, n-type InSb) using molecular beam epitaxy. Then, at step 1020, one (in the case of a photodiode) or more (in the case of a sensor array) detector regions are formed in the InSb substrate by implanting suitable P+ species directly through the AlInSb passivation layer.

Figure 11:
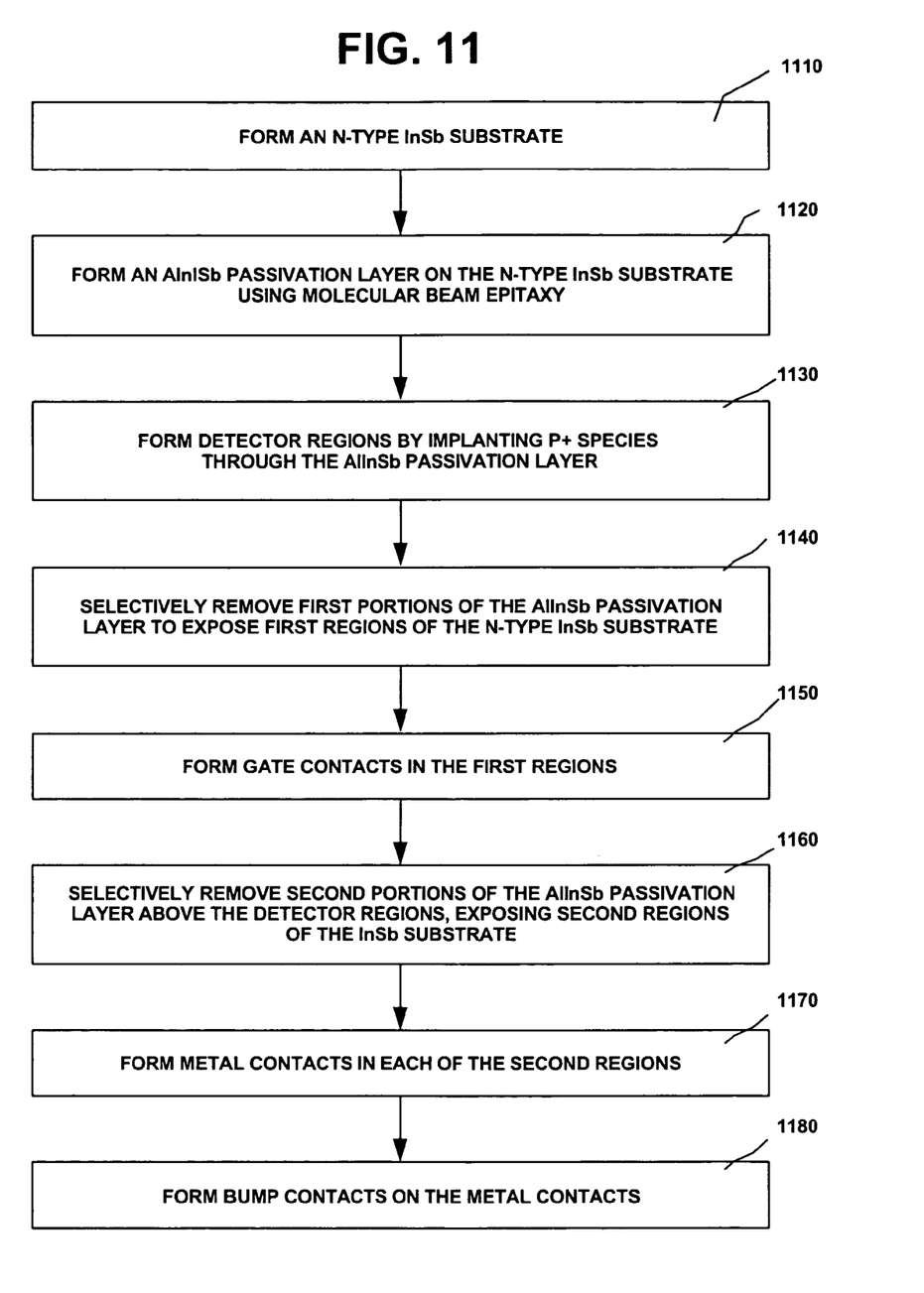
FIG. 11 is a flow chart depicting a method in accordance with the invention.

FIG. 11 is a flowchart depicting a method for making an InSb sensor array in accordance with the invention. At step 1110, an n-type InSb substrate is formed. Then, at step 1120, an AlInSb passivation layer is formed on the n-type InSb substrate using molecular beam epitaxy. Next, at step 1130, P+ regions are formed in the n-type InSb substrate just below the AlInSb passivation layer by implanting P+ species through the AlInSb passivation layer. The P+ regions together with adjacent portions of the n-type InSb substrate form p-n photodiodes. Then, at step 1140, first portions of the AlInSb passivation layer are selectively removed to expose first regions of the InSb substrate. Next, at step 1150, gate contacts are formed in the first regions of the n-type InSb substrate. Then, at step 1160, second portions of the AlInSb passivation layer are selectively removed to expose second regions of the InSb substrate coinciding with the P+ regions. Next, at step 1170, metal contacts are formed in each of the second regions. Then, at step 1180, bump contacts are formed atop each of the metal contacts.

An advantage of the invention is apparent in the ordering of the steps depicted in FIGS. 10-11. In particular, in the methods, the AlInSb passivation layer is formed in the InSb substrate before the detector regions are formed in the substrate. In comparison to prior processing methods, it has been found that this ordering results in relatively fewer defects in the InSb subtrate, improving the noise performance of sensor arrays made in accordance with the method. In turn, the increased performance of the sensor arrays have reduced the need for cryogenic cooling.

Thus it is seen that the foregoing description has provided by way of exemplary and non-limiting examples a full and informative description of the best method and apparatus presently contemplated by the inventors for fabricating InSb infrared photodiodes and sensor arrays with improved passivation layers. One skilled in the art will appreciate that the various embodiments described herein can be practiced individually; in combination with one or more other embodiments described herein; or in combination with fabrications methods differing from those described herein. Further, one skilled in the art will appreciate that the present invention can be practiced by other than the described embodiments; that these described embodiments are presented for the purposes of illustration and not of limitation; and that the present invention is therefore limited only by the claims which follow.

We claim:

1. A method comprising:
   forming a passivation layer on a first surface of a Group III-V substrate using a wide bandgap material; and
   selectively implanting P+ species through the passivation layer to form P+ regions below the first surface of the Group III-V substrate, the P+ regions in combination with adjacent portions of the Group III-V substrate forming photodiode detectors.

2. The method of claim 1 where the Group III-V substrate comprises InSb.

3. The method of claim 1 where the P+ species comprise Be.

4. The method of claim 1 where the wide bandgap material comprises AlInSb.

5. The method of claim 4 where the AlInSb passivation layer is formed by molecular beam epitaxy.

6. The method of claim 4 further comprising:
   selectively removing the AlInSb passivation layer, exposing first regions of the Group III-V substrate; and
   forming gate contacts in the first regions of the Group III-V substrate.

7. The method of claim 6 further comprising:
   selectively removing the AlInSb passivation layer above the photodiode detectors to expose second regions of the Group III-V substrate; and
   forming metal contacts in the second regions, the metal contacts contacting the photodiode detectors.

8. The method of claim 7 further comprising:
   forming bump contacts atop the metal contacts formed in the second regions.

9. The method of claim 8 where the bump contacts are formed from In.

10. The method of claim 7 further comprising:
    applying an antireflection coating to a second surface side of the substrate, the second surface opposite to the first surface.

11. The method of claim 1 where a bandgap of the passivation layer is wider than a bandgap of the Group III-V substrate.

12. The method of claim 1 where the wide bandgap material is selected in dependence on lattice constant.

13. The method of claim 12 where the lattice constant of the wide bandgap material is compatible with a lattice constant of the Group III-V substrate.

14. A photodiode comprising:
    an n-type InSb substrate, the n-type InSb substrate having first and second surfaces;
    a P+ region formed in a region of the n-type InSb substrate below the first surface of the n-type InSb substrate;
    an AlInSb passivation layer positioned atop the first surface of the n-type InSb substrate, the AlInSb passivation layer having an opening above the P+ region;
    a metal contact positioned in the opening above the P+ detector; and
    a bump contact positioned atop the metal contact.

15. The photodiode of claim 14 further comprising:
    an antireflection coating on the second surface of the n-type InSb substrate, the second surface directly opposite to the first surface of the n-type InSb substrate.

16. An infrared sensor array comprising:
    an n-type InSb substrate having first and second surfaces;
    a two-dimensional array of photodiode detectors comprising non-contiguous P+ regions positioned beneath the first surface of the n-type InSb substrate and portions of the n-type InSb susbtrate adjacent to the P+ regions;
    an AlInSb passivation layer positioned atop the first surface of the n-type InSb substrate;
    a plurality of first openings in the AlInSb passivation layer exposing the InSB substrate;
    a plurality of gate contacts, each of the plurality of gate contacts formed in one of the plurality of first openings;
    a plurality of second openings formed in the AlInSb passivation layer above each of the P+ regions;
    a plurality of metal contacts, each of the plurality of metal contacts formed in one of the plurality of second openings above each of the P+ regions; and
    a plurality of bump contacts, each of the plurality of bump contacts positioned above one of the plurality of metal contacts.

17. The sensor array of claim 16 further comprising:
    an antireflection coating formed on the second surface of the InSb substrate, the second surface opposite from the first surface.

18. A method for forming a sensor array comprising:
    forming an AlInSb passivation layer on a first surface of an InSb substrate;
    forming a two-dimensional array of non-contiguous photodiode detectors by implanting P+ species through the AlInSb passivation layer;
    selectively removing first portions of the AlInSb passivation layer to expose first regions of the n-type InSb substrate;
    forming gate contacts in the first regions;
    selectively removing second portions of the AlInSb passivation layer above the photodiode detectors, exposing second regions of the InSb substrate;
    forming metal contacts in each of the second regions; and
    forming bump contacts on the metal contacts.

19. The method of claim 18 further comprising:
    forming an antireflection coating on a second surface of the InSb opposite from the first surface.

* * * * *